(12) United States Patent
Tegeler et al.

(10) Patent No.: US 6,788,145 B2
(45) Date of Patent: Sep. 7, 2004

(54) CIRCUIT CONFIGURATION FOR PRODUCING EXPONENTIAL PREDISTORTION FOR A VARIABLE AMPLIFIER

(75) Inventors: Martin Tegeler, Aying (DE); Markus Zannoth, München (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 10/639,400

(22) Filed: Aug. 12, 2003

(65) Prior Publication Data

US 2004/0032298 A1 Feb. 19, 2004

Related U.S. Application Data

(63) Continuation of application No. PCT/DE02/00328, filed on Jan. 30, 2002.

(30) Foreign Application Priority Data

Feb. 12, 2001 (DE) .......................................... 101 06 388

(51) Int. Cl.[7] ................................................. H03F 3/45

(52) U.S. Cl. ....................................................... 330/254

(58) Field of Search ................................ 330/252, 254; 327/346, 356, 359

(56) References Cited

U.S. PATENT DOCUMENTS

| 4,075,574 A | 2/1978 | Gilbert | 330/257 |
| 4,156,283 A | 5/1979 | Gilbert | 364/841 |
| 5,874,857 A | 2/1999 | Roth et al. | 330/254 |
| 6,111,463 A | * | 8/2000 | Kimura | 330/254 |

FOREIGN PATENT DOCUMENTS

| EP | 0 444 361 A2 | 9/1991 |
| GB | 2 323 728 A | 9/1998 |
| WO | 95/07574 | 3/1995 |

* cited by examiner

*Primary Examiner*—Steven J. Mottola
(74) *Attorney, Agent, or Firm*—Laurence A. Greenberg; Werner H. Stemer; Ralph E. Locher

(57) ABSTRACT

A circuit is specified for producing exponential predistortion for a variable amplifier that contains two parallel-connected, controlled current paths, each having a diode that is followed by a differential amplifier stage. The area ratio of the first diode and the second diode is in this case equal to the area ratio of the first transistor and the second transistor in the differential amplifier. Therefore, a current produced on the output side has exponential predistortion in comparison to a control signal that can be applied on the input side. This makes it possible to drive linear amplifiers dB-linearly. The present circuit can be used for radio-frequency purposes and allows good noise characteristics as well as a high degree of insensitivity to process parameter and temperature fluctuations.

10 Claims, 4 Drawing Sheets

CIRCUIT CONFIGURATION FOR PRODUCING EXPONENTIAL PREDISTORTION FOR A VARIABLE AMPLIFIER

CROSS-REFERENCE TO RELATED APPLICATION

This application is a continuation of copending International Application No. PCT/DE02/00328, filed Jan. 30, 2002, which designated the United States and was not published in English.

BACKGROUND OF THE INVENTION

FIELD OF THE INVENTION

The present invention relates to a circuit configuration for producing exponential predistortion for a variable amplifier.

Amplifiers, for example power amplifiers or low-noise amplifiers, such as those that are normally used for radio-frequency purposes normally have a variable gain. The characteristic with which the gain can be adjusted may in this case have to be linear, or may have to follow what is referred to as a dB-linear characteristic. A dB-linear characteristic is in this case distinguished by the fact that the output power $P_{out}$ in dBmW is proportional to the control voltage $U_{control}$ on the input side, in accordance with the following formula:

$$P_{out}[dBm]=10\cdot\log P_{out}[W] \propto U_{control}$$

In most widely available amplifiers, the output power is, however, directly proportional to the control voltage, rather than being logarithmically proportional. The control voltage must therefore be predistorted in an appropriate manner in a stage upstream of the amplifier, in order to obtain a dB-linear characteristic.

A circuit by which a described predistortion can be achieved is specified in the document by Professor Robert Meyer, UC Berkeley EECS 242 (NTU Course: IC775CA), titled "Advanced Integrated Circuits For Communication", Course Notes (Lectures 1–43, Vol. I of II, University of California at Berkeley College of Engineering, 1999, Lecture 4, p. 9). In this case, the control voltage of an amplifier is first in an exponential form, in order to obtain a dB-linear characteristic overall. The predistortion is provided by using a translinear circuit which forms a temperature-stable, exponential relationship between the control variable (current/voltage) and an output variable.

The basic circuit as specified in the document cited above for producing exponential predistortion is subject, however, to the disadvantage that the ideally calculated, exponential transfer function changes as a result of process tolerances to which the components that are required to produce it are subject, and due to temperature changes during operation of the circuit. Furthermore, the specified circuit requires a relatively large number of components as well as a large transistor area associated with this. The large number of transistors required also has the disadvantage that the overall circuit can achieve only mediocre noise characteristics.

SUMMARY OF THE INVENTION

It is accordingly an object of the invention to provide a circuit configuration for producing exponential predistortion for a variable amplifier that overcomes the above-mentioned disadvantages of the prior art devices of this general type, which predistortion is improved in terms of manufacturing and temperature-dependent tolerances.

With the foregoing and other objects in view there is provided, in accordance with the invention, a circuit configuration for producing exponential predistortion for a variable amplifier. The circuit configuration contains a first controlled current path having a first diode, and a second controlled current path having a second diode and connected in parallel with the first controlled current path. Controlled currents of the controlled current paths include a common-mode current component for setting an operating point of the first and second diodes and a differential current component for providing a small-signal drive. A differential amplifier contains a first transistor having a control input connected to the first diode, and a second transistor having a control input connected to the second diode. A ratio of effective transistor areas of the second transistor and the first transistor is equal to a ratio of effective diode areas of the second diode and the first diode.

The described circuit has two diodes of different size, which are followed by a differential amplifier with two transistors of different size. In this case, the larger of the two diodes is connected to the larger transistor, while the smaller diode is connected to the smaller transistor. The diodes are driven by currents that contain a common-mode current for setting the operating point of the diode as well as a differential current that carries the actual useful signal. Output currents are produced on the output side of the differential amplifier in order to drive an amplifier with the asymmetric predistortion that is produced by the described circuit. The asymmetric predistortion and the asymmetric differential amplifier allow the present circuit to produce an approximate dB-linear transfer function. The area ratio of the first and second diodes and of the first and second transistors can in this case be matched to the respective requirements, as described in more detail in the following text. Since the described circuit can be produced with a small number of components, it can be implemented with good noise characteristics. Furthermore, the described circuit is insensitive to process technology and temperature fluctuations.

Since the diodes have different areas, this results in the diode voltages being asymmetric. The diode voltages are used for controlling a differential amplifier, at whose output the desired, predistorted input signal is produced as a differential current for an amplifier.

In order to achieve good paring, the diodes may be transistors that are connected as diodes.

In one preferred embodiment of the present invention, the current in the first and second controlled current paths is controlled by a second voltage controlled differential amplifier with a first output which is connected to the first diode, and with a second output which is connected to the second diode. The second differential amplifier is used to convert a control signal, which is in the form of a differential voltage signal and is used for controlling the output power of an amplifier, to the control currents required for controlling the diode current paths. The second differential amplifier accordingly operates as a voltage/current converter.

In a further preferred embodiment of the present invention, the second differential amplifier has two bipolar transistors, whose emitter connections are connected to one another in order to produce negative feedback via a resistor. The negative feedback for the second differential amplifier may be particularly advantageous when its deflection in the small signal range exceeds a range in which sufficiently good linearization is available even without negative feedback. In any case, it should be remembered that the controlled currents in the first and second current paths are proportional to the differential input voltages.

In a further preferred embodiment of the present invention, the ratio of the effective transistor areas and the ratio of the effective diode areas to one another are in each case set by connecting two or more identical components in parallel. By way of example, effective area ratios of the transistors and of the diodes of 2:1, 3:1, 3:2 etc. with respect to one another can thus be produced. Since identical components are in case used in both current branches, particularly good pairing can be achieved.

In a further preferred embodiment of the present invention, the first diode contains two diodes, which are connected in parallel and are each of the same type as the second diode, and the first transistor contains two transistors which are connected in parallel and are each of the same type as the second transistor, so that this results in an area ratio of 2:1 in each case. As described in detail in the following text, which describes exemplary embodiments on the basis of derivations and parametric studies, an area ratio of 2:1 results in a dB-linear transfer function for the described circuit for producing exponential predistortion for a linear preamplifier.

In a further preferred embodiment of the invention, an area ratio of 3:1 is obtained by connecting three components, or three transistors, in parallel. Overcompensation such as this may be desirable depending on the application of the circuit for producing predistortion.

In a further preferred embodiment of the present invention, the first transistor in the first differential amplifier is connected on the control side directly to the first diode and the second transistor in the first differential amplifier is connected on the control side directly to the second diode. In this case, the potential at the diode connections, which are connected to the control inputs of the transistors, controls the differential amplifier as a function of the currents flowing through the diodes.

In a further preferred embodiment of the present invention, a load diode is in each case provided in a third and a fourth current path, which are controlled by the first differential amplifier and which respectively contain a controlled part of its first or second transistor. The predistorted current which can be derived from the first differential amplifier is applied to the load diodes in order to provide compensation to the characteristic of a differential amplifier, for example a current balance, which can be connected for gain variation.

In a further preferred embodiment of the present invention, on the output side, a first differential amplifier is connected to a current balance, whose control inputs are connected to the load diodes, and on the output side, an electrical load, for example an antenna or a matching network, can be connected to the current balance. The current balance provides variable gain.

A radio-frequency signal, for example, can be supplied to one input of the current balance and is amplified in accordance with the desired, applied nominal gain.

Other features which are considered as characteristic for the invention are set forth in the appended claims.

Although the invention is illustrated and described herein as embodied in a circuit configuration for producing exponential predistortion for a variable amplifier, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
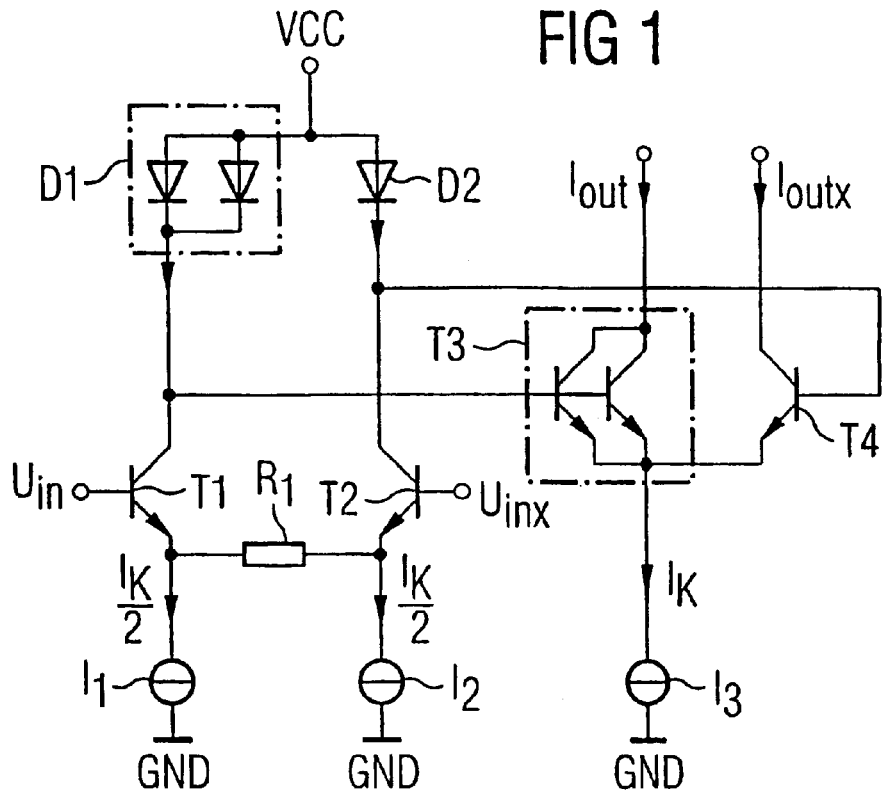
FIG. 1 is a circuit diagram of a first exemplary embodiment of a circuit according to the invention for predistortion of a control signal.

Referring now to the figures of the drawing in detail and first, particularly, to FIG. 1 thereof, there is shown a first differential amplifier T3, T4 and current branches. The current branches are connected on a control side and each contains a diode D1, D2 and a voltage controlled bipolar transistor T1, T2.

In detail, a differential input voltage $U_{in}$, $U_{inx}$ can be supplied to the control side, that is to say to a base connection, of the transistors T1, T2, which are in the form of npn bipolar transistors T1, T2 and form a differential amplifier with negative feedback. A control voltage is used to set the variable gain of the amplifier. Emitter connections of the transistors T1, T2 that form a second differential amplifier are connected to one another via a resistor R1 in order to form the negative feedback. Furthermore, the emitter connections are connected via a respective current source I1, I2 to a reference ground potential connection GND. On a collector side, the transistors T1, T2 are connected via the respective diode D1, D2 to a supply potential connection VCC. In this case, the first diode D1 has two parallel-connected diode elements, each of whose configurations correspond to that of the second diode D2.

This results in particularly good pairing of the diodes D1, D2 and an area ratio C of the second diode D2 and the first diode D1 of C=0.5.

The potential that is produced on a cathode side of the diodes D1, D2 by the controlled currents in the current branches is used to drive the first differential amplifier T3, T4. The first differential amplifier contains a first transistor T3, which is connected on the control side to the cathode connection of the first diode D1, and a second transistor T4, which is connected on the control side to the cathode connection of the second diode D2. Emitters of the transistors T3, T4 are connected directly to one another in order to form the first differential amplifier. With regard to the first differential amplifier T3, T4, it is important to note that an area ratio of the second transistor T4 and the first transistor T3 is equal to the area ratio C of the second diode D2 and the first diode D1. Accordingly, the first transistor T3 contains two npn bipolar transistors of the same type and configuration as the npn bipolar transistor T4 in order to provide an area ratio of C=0.5. The joint emitter node of the transistors T3, T4 is connected to a current source I3, which supplies an operating point current $I_K$. Since, in the exemplary embodiment shown in FIG. 1, the diodes D1, D2 are in the form of transistors connected as diodes, and are of the same type as the transistors T3, T4 in the first differential amplifier, therefore the currents in the current sources I1, I2 of the first and second current paths each amount to half the operating point current $I_k/2$. The output of the described circuit for producing exponential predistortion, the output being a current output, is connected to the collector connections of the transistors T3, T4 of the first differential amplifier, and is annotated $I_{out}$, $I_{outx}$.

The transistors T1, T2 in the second differential amplifier, which has negative feedback, may be regarded as a voltage/current converter stage. These convert the differential input voltage $U_{in}$, $U_{inx}$ that is provided to an output current $I_{out}$, $I_{outx}$ with the desired distortion, in this case with the area ratio C=0.5.

In addition to the small number of components required, which lead to good noise characteristics, the described circuit in the exemplary embodiment shown in FIG. 1 provides good pairing of the diode and transistor components that are used, and no sensitivity to temperature changes during operation or to process technology tolerances from manufacture.

Figure 2:
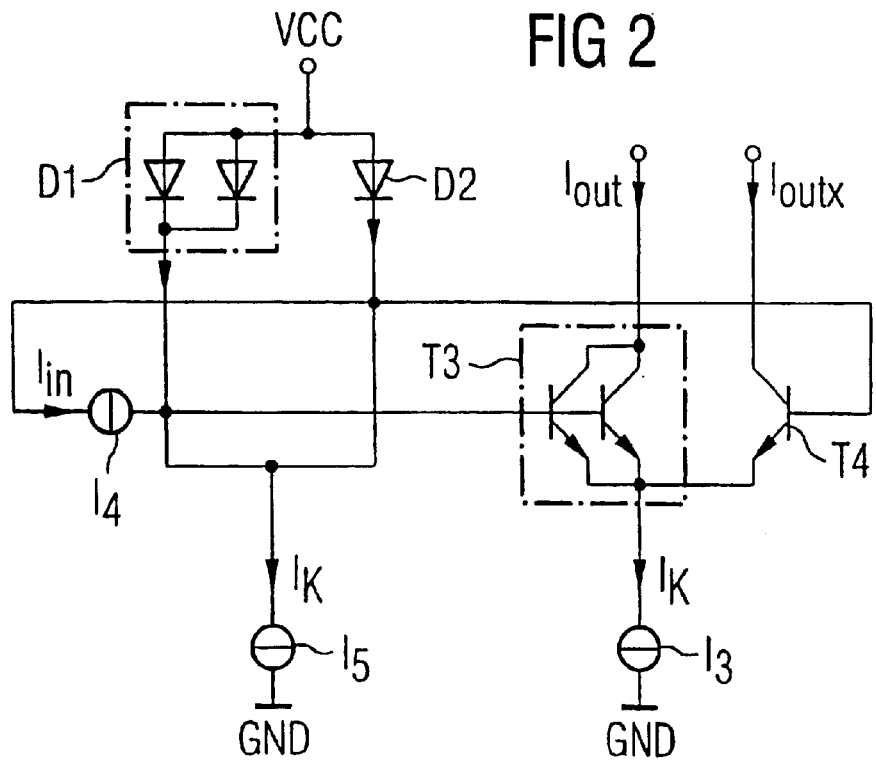
FIG. 2 is circuit diagram of the circuit that has been further simplified for mathematical description of the circuit.

FIG. 2 shows a simplified circuit diagram corresponding to FIG. 1 for calculation or mathematical modeling of the circuit according to the invention. In this case, the current $I_{in}$ that is caused by the second differential amplifier T1, T2 through the diodes D1, D2, which can be interpreted as a balanced signal, is referred to as an additional current source I4. This results in a current flow through the first diode D1 of $I_k-I_{in}$, with a current of $I_k+I_{in}$ through the second diode D2.

The differential output current $I_{diff}$ which is formed from the difference between the output currents $I_{out}$, $I_{outx}$ at the output of the circuit shown in FIG. 2 depends in particular on the current densities in the diodes D1, D2 and in the differential amplifier transistors T3, T4 of the first differential amplifier, and can be derived as follows: the interconnection of the diodes and transistors to one another as shown in FIG. 2 and the different area ratio result in the current densities $I_s$ in the diode being:

$$Is_2 = C \cdot Is_1$$

where $Is_2$ is equal to the current density in the second diode D2, and $Is_1$ is equal to the current density in the first diode D1.

Analogously, the current densities in the transistors T3, T4 are:

$$Is_4 = C \cdot Is_3$$

where $Is_3$ is equal to the current density in the first differential amplifier transistor T3, and $Is_4$ is equal to the current density in the second differential amplifier transistor T4.

Currents of $Ic_1$ and $Ic_2$ flow through the diodes D1, D2, respectively. The input current $I_{in}$ and the operating point current $I_k$ in the diodes D1, D2, see FIG. 2, result in the currents through the diodes D1, D2 being as follows:

$$Ic_1 = I_k + I_{in}$$

and $$Ic_2 = I_k - I_{in}$$

Thus, if the diode characteristics are known, the voltages $U_{ak1}$, $U_{ak2}$ across the diodes D1, D2 can now be stated to be:

$$U_{ak1} = m \cdot U_T \cdot (ln(Ic_1/Is_1)+1)$$

and $$U_{ak2} = m \cdot U_T \cdot (ln(Ic_2/Is_2)+1)$$

The factor m is in this case the exponential factor in the diode module, and can be assumed to be 1. The operating point current $I_k$ is in this case used as a normalization variable, and is likewise assigned the value 1. If the input voltage to a differential amplifier is assumed to be $u_d$, then the difference current $I_{diff}$ at the output is given by:

$$I_{diff} = I_k \cdot \frac{1-\left(\frac{Is_3}{Is_4}\right)\exp\left(\frac{u_d}{u_T}\right)}{1+\left(\frac{Is_3}{Is_4}\right)\exp\left(\frac{u_d}{u_T}\right)}.$$

If the diode voltages $u_{ak1}$, $u_{ak2}$ are now substituted for the input voltage $u_d$, then the differential output current is given by:

$$I_{diff} = \frac{-1+C^2+(1+C^2)I_{in}}{1+C^2+(-1+C^2)I_{in}}.$$

This relationship results in a family of characteristics, as a function of the area ratio C. If C=1, this results in a straight line, provided that the representation is not logarithmic.

Figure 3:
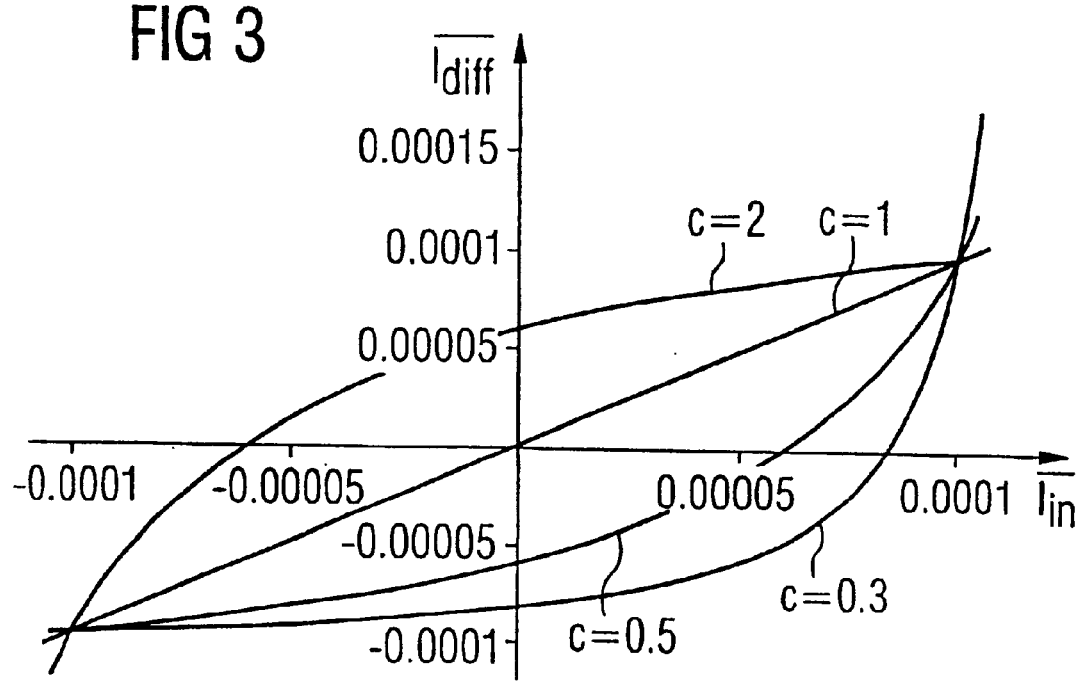
FIG. 3 is a graph showing a transmission response of the predistortion that can be achieved with the circuit shown in FIG. 1 or 2, as a function of the area ratio.

FIG. 3 shows the transmission response of the predistortion, that is to say the difference current $I_{diff}$ as a function of the input current $I_{in}$. The input current $I_{in}$ and the difference current $I_{diff}$ are in this case plotted in a normalized form, and the normalized variables are identified by an overscore. The parameter for the space ratio C has been plotted in a range from C=0.3 to C=2 for the values C=0.3, C=0.5, C=1 and C=2. It can be seen that, as expected, a straight line is obtained for C=1, provided that the representation is not logarithmic.

Figure 4:
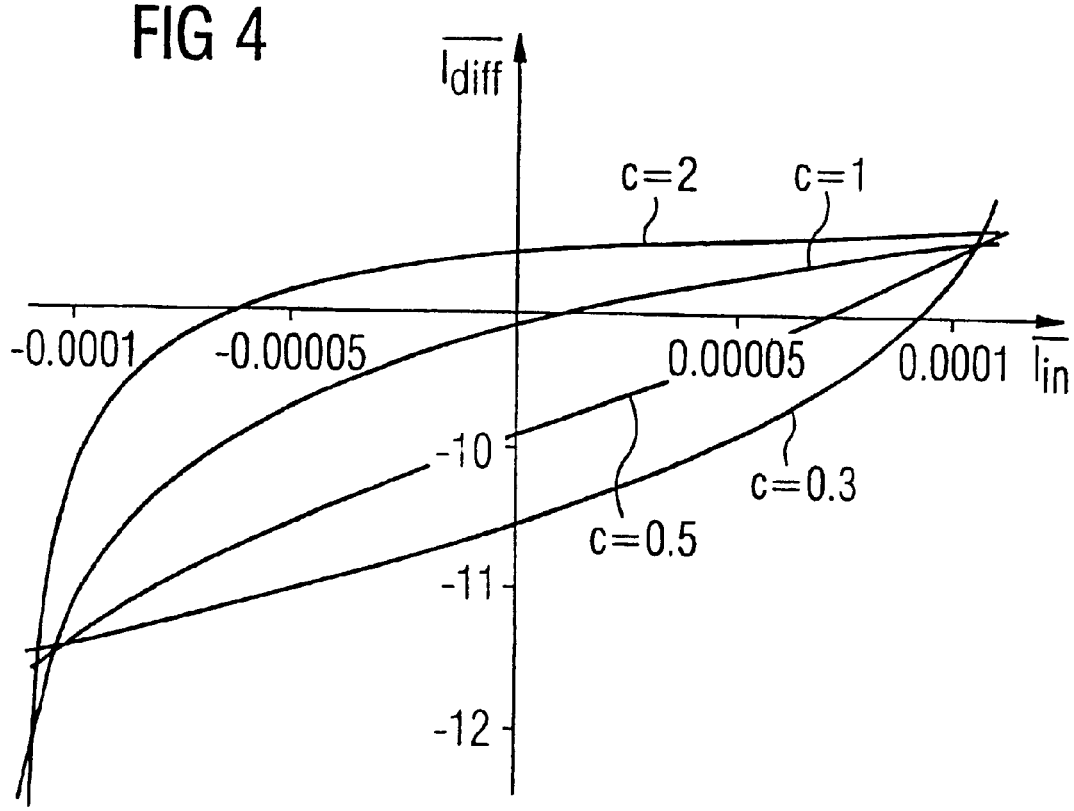
FIG. 4 is a graph showing the transmission response of the described circuit for producing exponential predistortion, with a logarithmically scaled abscissa.

FIG. 4 likewise shows a parametric study of the function of the difference current as a function of the input current for various parameter values for the area ratio C, but on a logarithmic/linear representation, with the difference current and the input current being shown with suitable normalization. In this case, the ordinate is linear, while in contrast the abscissa has a logarithmic scale. It can be seen from this that the area ratio C=0.5 results approximately in a straight line, at least in a useable current range. FIG. 4 shows, overall, the transmission response of the circuit shown in FIG. 2.

Figure 5:
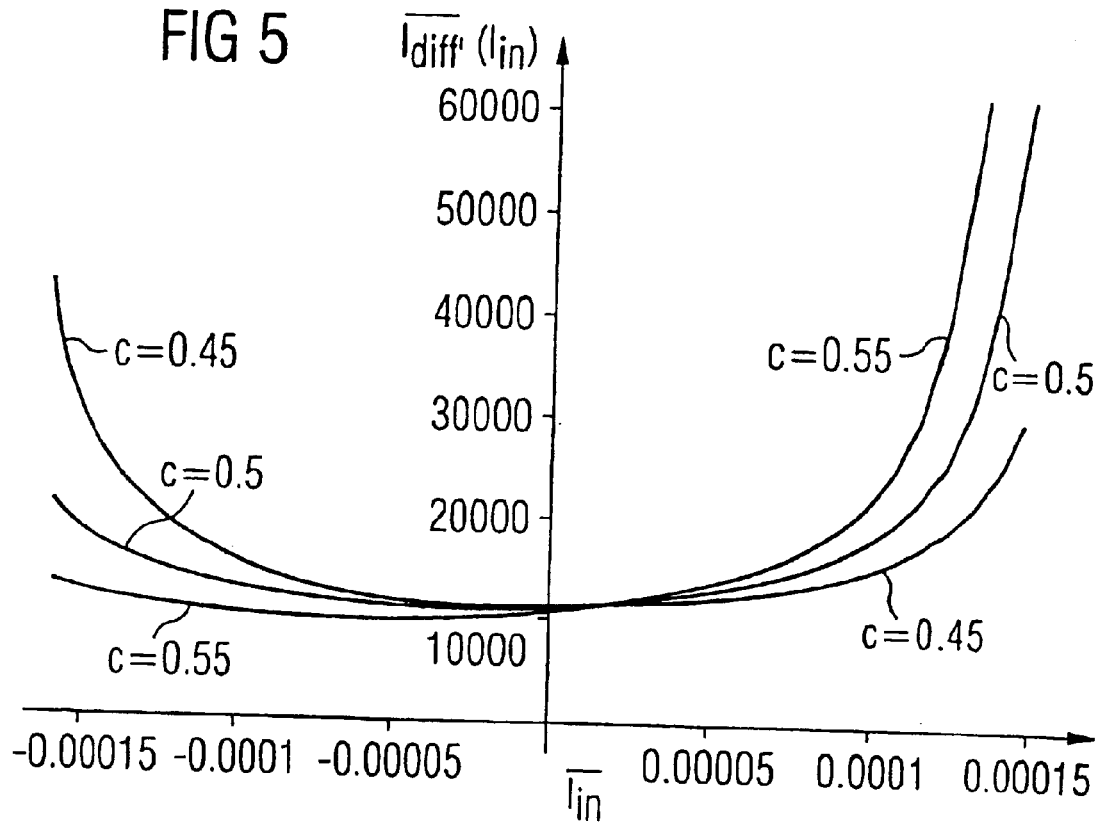
FIG. 5 is a graph showing a derivation of the family of curves for the transfer function for various parameter values of the area ratio.

Likewise in a suitably standardized form, FIG. 5 describes the derivation of the difference current function as a function of the input current. In this case, C=0.45; C=0.5 and C=0.55 were chosen as parameters for the area ratio C in the area around C=0.5 of interest as determined in accordance with FIG. 4. As can be seen, the derivation of the family of characteristics in the range in which the function is used has a constant gradient.

As can be seen from the described families of characteristics shown in FIGS. 3 to 5, the exponential relationship can be approximated with the aid of a function $$f(x) = \frac{a + b \cdot x}{b + a \cdot x}$$

to obtain a virtually dB-linear characteristic over a wide range for the proposed circuit. In the edge regions, the gradient of the characteristic increases, see FIG. 6, which is a desirable effect in order to compensate for compression. Furthermore, the described circuit, as already mentioned, offers the advantage that it requires a small number of components, together with the good noise characteristics associated with it, and the fact that the characteristic is independent of temperature and process fluctuations.

Figure 6:
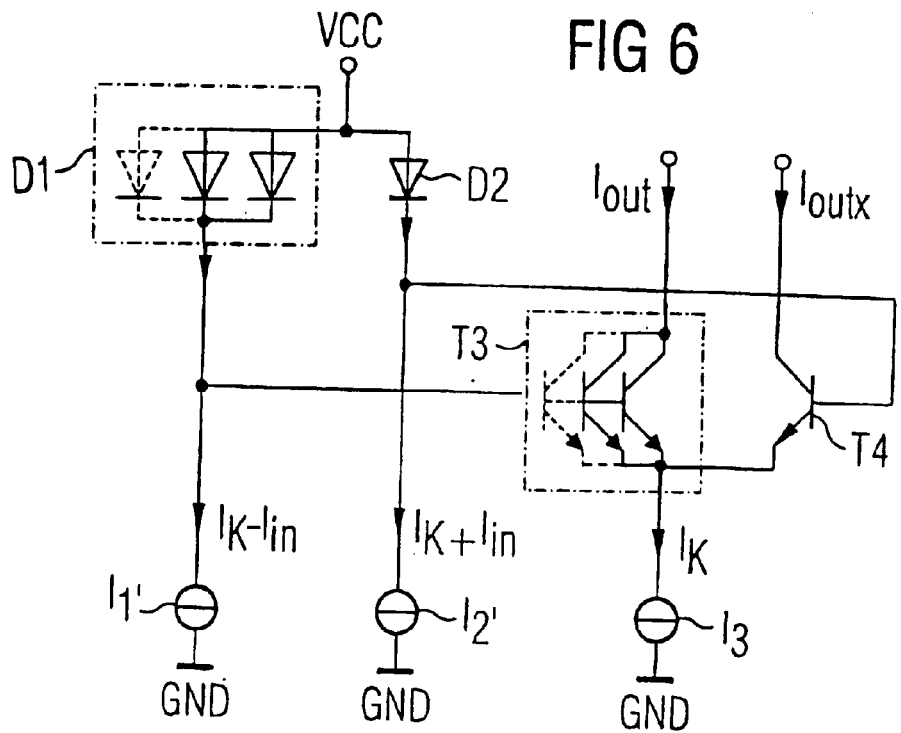
FIG. 6 is a circuit diagram of a further exemplary embodiment of the invention on the basis of a simplified equivalent circuit.

FIG. 6 shows a further, simplified circuit diagram of a circuit according to the invention for providing exponential predistortion for a linear amplifier with two controlled current paths which each contain a diode D1, D2, and a differential amplifier T3, T4, which is connected to it and is controlled by the diode voltages, which are produced as a function of the controlled diode currents through the diodes D1, D2. The area ratio C of the second diode D2 and the first diode D1 is in this case equal to the area ratio of the second transistor T4 and the first transistor T3 of the first differential amplifier. The first and second diodes, D1, D2 are each connected on the cathode side first to a current source $I_{1'}$, $I_{2'}$, which is connected to the reference ground potential connection GND, and second to in each case one control input of the first differential amplifier T3, T4, as already described with reference to FIGS. 1 and 2. While the current source $I_{1'}$ produces a current $I_k - I_{in}$ which corresponds to the difference between the operating point current $I_k$ of the diodes and the input current $I_{in}$ as shown in FIG. 2, the second current source $I_{2'}$ actually produces the sum $I_k + I_{in}$ of the operating point current $I_k$ through the diodes and the input current $I_{in}$ in the simplified circuit diagram shown in FIG. 2. The two diodes D1, D2 are of different sizes, with the diode D1 with the larger area being connected to the transistor T1 with the larger area, and the smaller diode D2 being connected to the smaller transistor T4. The diodes D1, D2 are driven by the described currents Ik–Iin, Ik+Iin. These currents contain a differential current $I_{in}$ for driving the diodes and a common-mode current $I_k$ for setting the operating point of the diodes. The output of the differential amplifier produces output currents $I_{out}$, $I_{outx}$, which have a transmission response with predistortion with respect to the input signal to the circuit.

Figure 7:
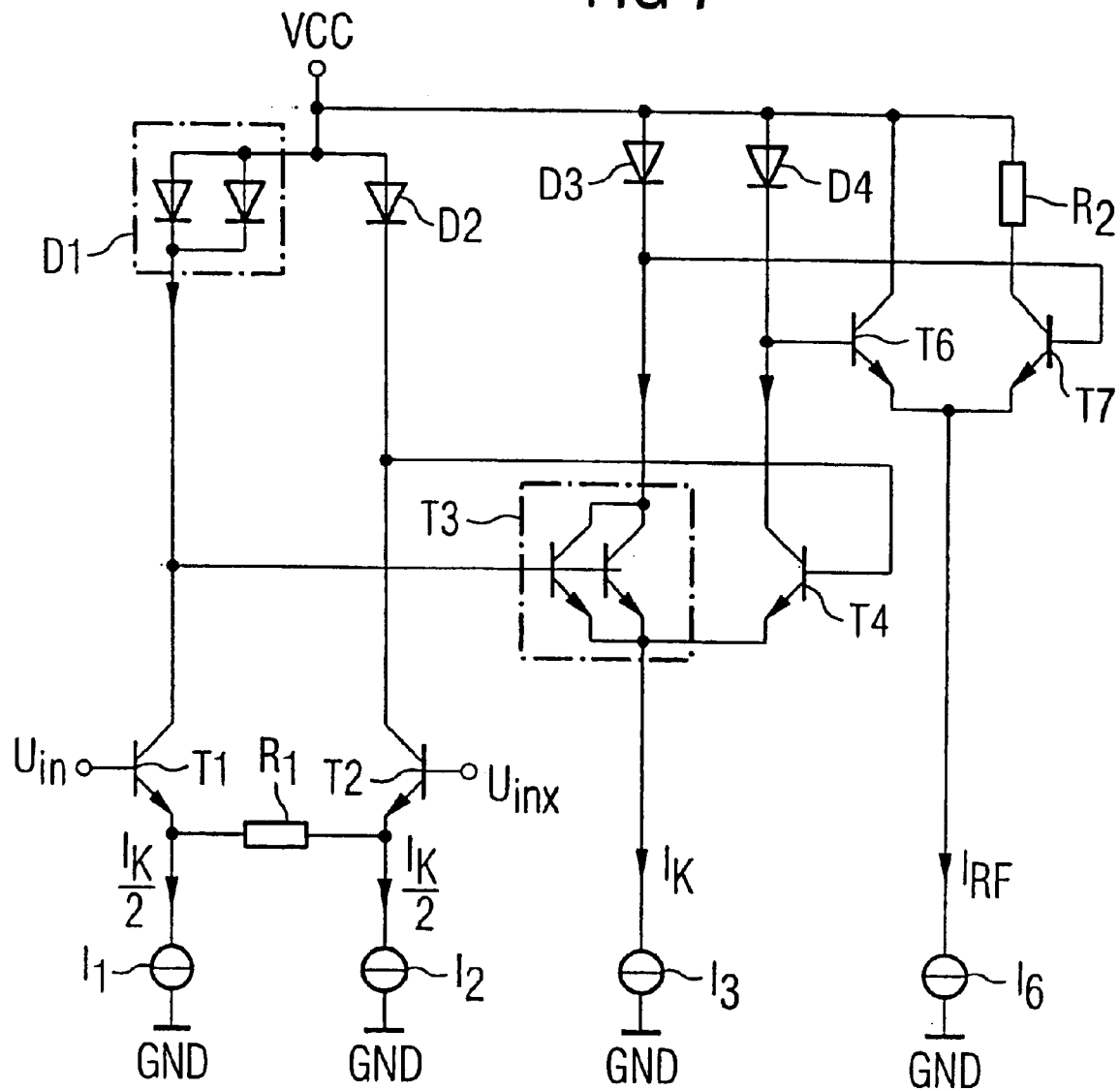
FIG. 7 is a circuit diagram of a further exemplary embodiment of the invention in a development of the circuit as shown in FIG. 1, with a current balance and an electrical load connected.

Finally, FIG. 7 shows a development of the circuit in FIG. 1 with a current balance T6, T7 and an electrical load $R_2$. The electrical load $R_2$ may, for example, be an antenna or a matching network.

In detail, a diode D3, D4 is in each case connected as a load diode to the collector connections of the differential amplifier transistors T3, T4 of the first differential amplifier, and the predistorted current that is produced is fed into the diodes. Therefore it is possible to compensate for the characteristic of the differential amplifiers T6, T7 which are used to vary the gain and which jointly form a current balance. A radio-frequency input signal which is to be amplified and can be supplied as the current $I_{RF}$ on the emitter side to the current balance T6, T7 which is configured using bipolar circuit technology can now be varied on a dB-linear basis with the aid of the input voltage $U_{in}$, $U_{inx}$. The source for the radio-frequency signal $I_{RF}$ to be amplified is in this case referred to as a current source I6 and may, for example, be in the form of a low-noise amplifier or a power amplifier, with an open collector output.

All the described exemplary embodiments of the circuit provided for producing exponential predistortion for a linear amplifier have the common feature that they can be constructed using a small number of components, and thus have good noise characteristics. Furthermore, the characteristic of the desired, exponentially distorted transfer function is very largely independent of temperature fluctuations in the circuit during operation, and of process parameter fluctuations from the manufacture of such a circuit.

We claim:

1. A circuit configuration for producing exponential predistortion for a variable amplifier, comprising:

a first controlled current path having a first diode;

a second controlled current path having a second diode and connected in parallel with said first controlled current path, controlled currents of said controlled current paths including a common-mode current component for setting an operating point of said first and second diodes and a differential current component for providing a small-signal drive; and a differential amplifier containing a first transistor having a control input connected to said first diode, and a second transistor having a control input connected to said second diode, a ratio of effective transistor areas of said second transistor and said first transistor is equal to a ratio of effective diode areas of said second diode and said first diode, said first diode having a given effective diode area being different from a given effective diode area of said second diode.

2. The circuit configuration according to claim 1, wherein said differential amplifier includes a first differential amplifier, and a second voltage controlled differential amplifier provided for controlling currents in said first and second controlled current paths, said second voltage controlled differential amplifier has a first output connected to said first diode and a second output connected to said second diode.

3. The circuit configuration according to claim 2, further comprising a resistor, and said second voltage controlled differential amplifier has two bipolar transistors with emitter connections connected to one another for producing negative feedback through said resistor.

4. The circuit configuration according to claim 1, wherein the ratio of said effective transistor areas of said second transistor and said first transistor, and the ratio of said effective diode areas of said second diode and said first diode with respect to one another are in each case set by connecting at least two identical components in parallel.

5. The circuit configuration according to claim 4, wherein:

said first diode contains two diodes connected in parallel each having equivalent areas equal to a given area of said second diode, thus resulting in an area ratio C of 1:2; and said first transistor contains two transistors connected in parallel each having equivalent areas equal to a given area of said second transistor, thus resulting in the area ratio C of 1:2.

6. The circuit configuration according to claim 4, wherein:

said first diode contains three diodes connected in parallel and each has an equivalent area equal to a given area of said second diode, thus producing an area ratio C of 1:3; and said first transistor contains three transistors connected in parallel and each has an equivalent area equal to a given area of said second transistor, thus producing the area ratio C of 1:3.

7. The circuit configuration according to claim 2, wherein:
said first transistor of said first differential amplifier is connected by said control input directly to said first diode; and
said second transistor of said first differential amplifier is connected by said control input directly to said second diode.

8. The circuit configuration according to claim 2, wherein said first transistor has a controlled path;
wherein said second transistor has a controlled path; and
further comprising load diodes, a first of said load diodes disposed in a third current path and a second of said load diodes disposed in a fourth current path, said third and fourth load paths being controlled by said first differential amplifier, said third current path including said controlled path of said first transistor and said fourth current path including said controlled path of said second transistor.

9. The circuit configuration according to claim 8, further comprising:
an electrical load;
a current balance circuit having control inputs and an output side, said first differential amplifier having an output side connected to said current balance circuit, said control inputs of said current balance circuit connected to said load diodes, and said output side of said current balance circuit connected to said electrical load.

10. The circuit configuration according to claim 1, wherein the circuit configuration is configured using bipolar circuit technology.

* * * * *